(12) United States Patent
Eagle et al.

(10) Patent No.: US 11,758,664 B2
(45) Date of Patent: Sep. 12, 2023

(54) PROCESSOR MODULE RETENTION

(71) Applicant: International Business Machines Corporation, Armonk, NY (US)

(72) Inventors: Jason R. Eagle, Mantorville, MN (US); Scott R. LaPree, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 93 days.

(21) Appl. No.: 17/375,522

(22) Filed: Jul. 14, 2021

(65) Prior Publication Data
US 2023/0018261 A1    Jan. 19, 2023

(51) Int. Cl.
H05K 7/20    (2006.01)
H05K 1/18    (2006.01)
H05K 3/30    (2006.01)
H05K 1/02    (2006.01)

(52) U.S. Cl.
CPC ............ *H05K 1/18* (2013.01); *H05K 1/0203* (2013.01); *H05K 3/30* (2013.01); *H05K 7/2039* (2013.01)

(58) Field of Classification Search
CPC .......... H05K 1/18; H05K 1/0203; H05K 3/30; H05K 7/2039
See application file for complete search history.

(56) References Cited

U.S. PATENT DOCUMENTS

| | | |
|---|---|---|
| 5,671,118 A | 9/1997 | Blomquist |
| 6,676,429 B1 | 1/2004 | McHugh |
| 6,722,909 B1 | 4/2004 | McHugh |
| 7,009,844 B2 | 3/2006 | Farrow |
| 7,180,746 B2 | 2/2007 | Yu |
| 7,236,369 B2 | 6/2007 | Barina |
| 7,697,299 B2 * | 4/2010 | Desrosiers .......... H01L 23/4093 165/185 |
| 7,881,061 B2 | 2/2011 | Kuo |
| 7,948,756 B2 | 5/2011 | Du |

* cited by examiner

*Primary Examiner* — Anthony Q Edwards
*Assistant Examiner* — Hung Q Dang
(74) *Attorney, Agent, or Firm* — Grant M. McNeilly

(57) ABSTRACT

An apparatus includes a motherboard with a processor socket, a load frame connected to the motherboard adjacent to at least two sides of the processor socket, and a processor retainer rotatably connected to the load frame, the processor retainer being positionable in a closed position, an opened position, and an installation position. The processor retainer extends over the processor socket when the processor retainer is in the closed position.

19 Claims, 10 Drawing Sheets

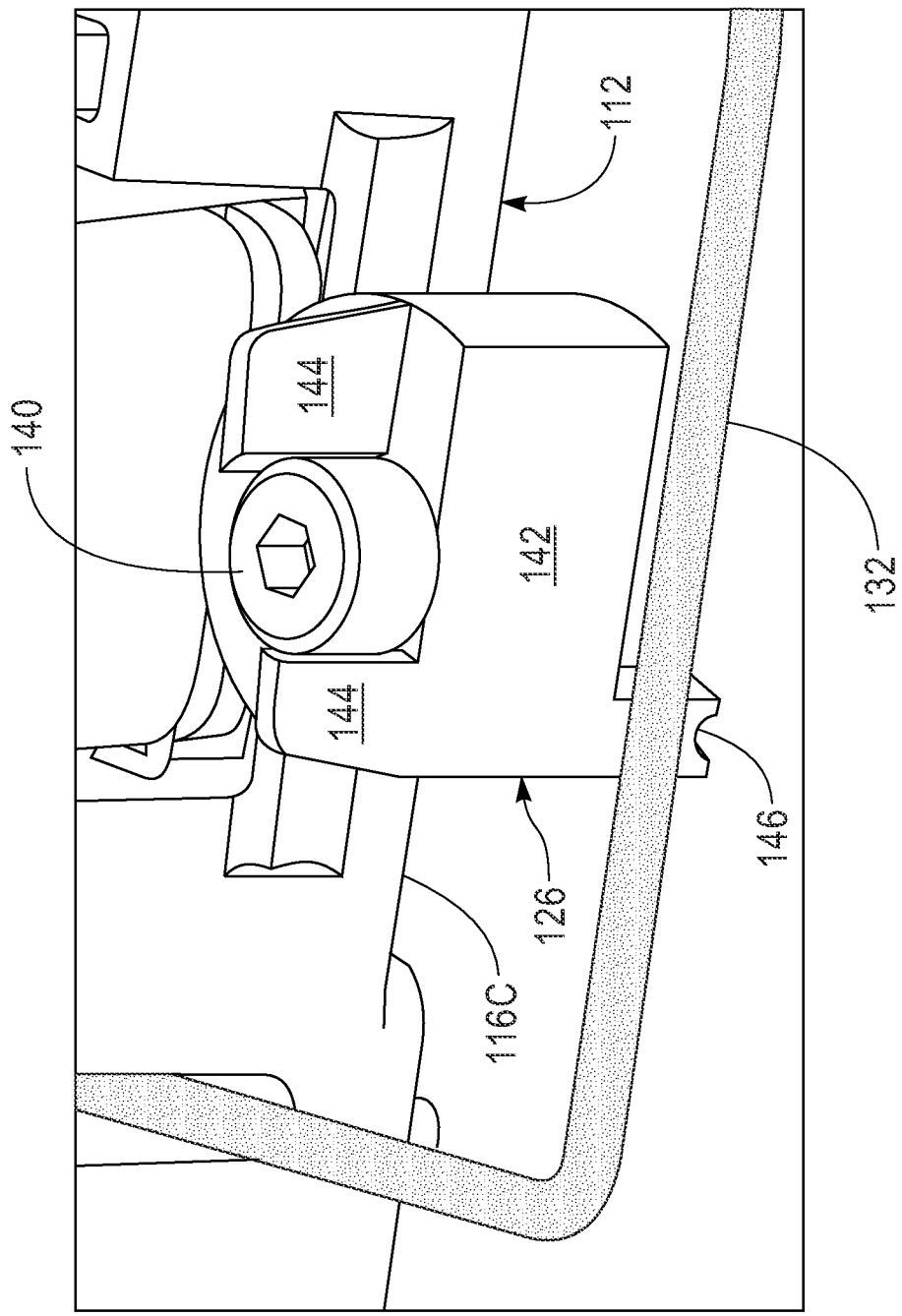

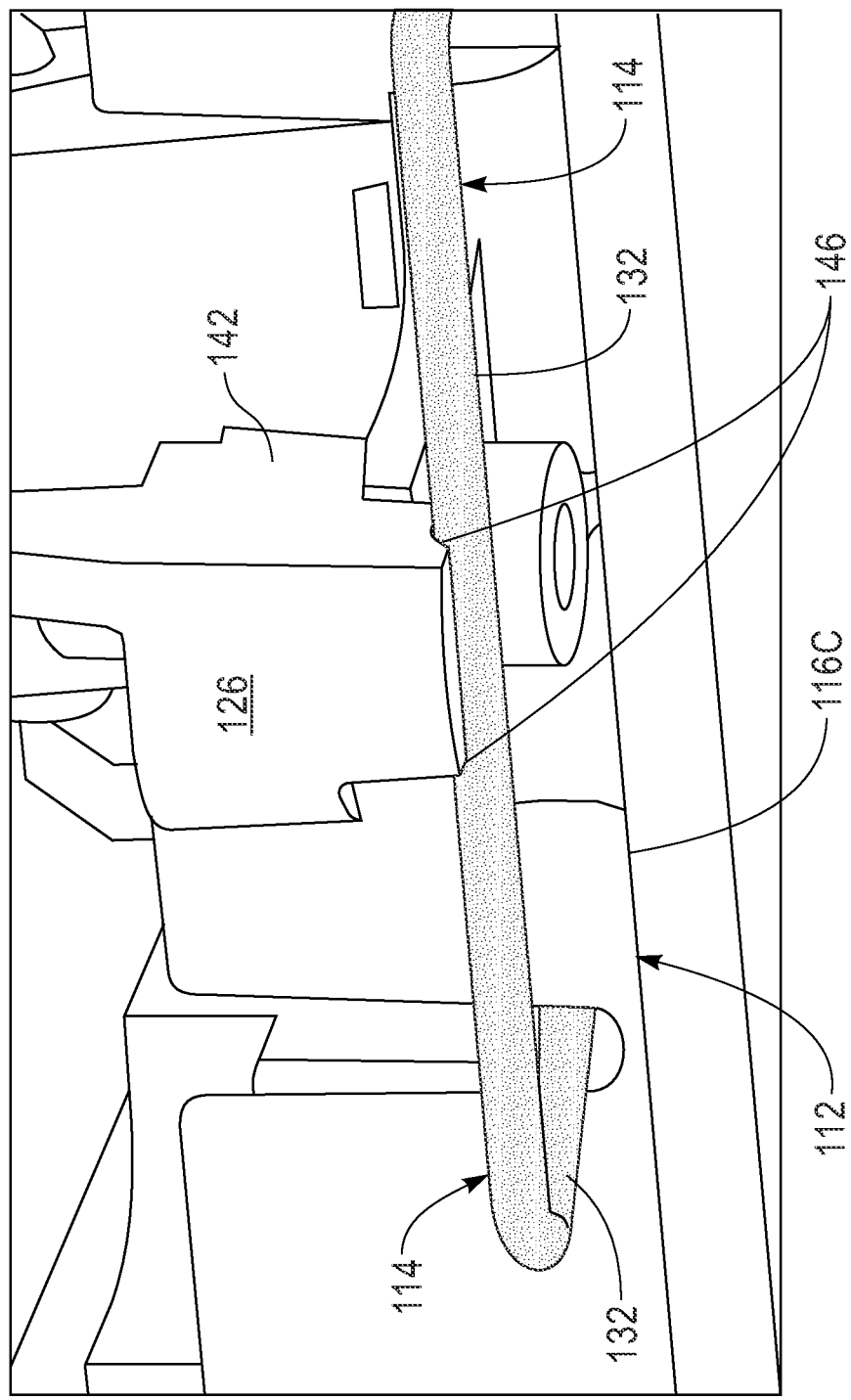

PROCESSOR MODULE RETENTION

BACKGROUND

The present disclosure relates to computer motherboard assemblies, and more specifically, to a processor module retention apparatus.

Data centers can include numerous server racks that themselves include numerous servers. The servers can include motherboards with processor sockers configured to connect to a processor module. The processor module itself can also include other communication connections aside from the processor socket. However, plugging and unplugging connectors from these connections can result in a detrimental amount of force being applied to the processor module. In some cases, such force can damage the processor module and/or the processor socket.

SUMMARY

According to one embodiment of the present disclosure, an apparatus includes a motherboard with a processor socket, a load frame connected to the motherboard adjacent to at least two sides of the processor socket, and a processor retainer rotatably connected to the load frame, the processor retainer being positionable in a closed position, an opened position, and an installation position. The processor retainer extends over the processor socket when the processor retainer is in the closed position.

According to one embodiment of the present disclosure, a method of assembling a computer assembly includes installing a load frame on a motherboard, opening a processor retainer, installing a processor module on the motherboard, closing the processor retainer over the processor module, and locking the processor retainer such that the processor retainer urges the processor module towards the motherboard.

According to one embodiment of the present disclosure, a system includes a housing, a motherboard connected to the housing and including a processor socket, a load frame connected to the motherboard and surrounding the processor socket, and a processor retainer connected to the load frame, the processor retainer being positionable in a closed position, an opened position, and an installation position. The processor retainer is removable from the load frame in the installation position but not removable in the closed position or in the opened position, and the housing blocks the processor retainer from being positioned in the installation position when the load frame is connected to the motherboard.

BRIEF DESCRIPTION OF THE DRAWINGS

FIG. 6A is a perspective view of a lock in an unlocked position, in accordance with an embodiment of the present disclosure.

FIG. 6B is a perspective view of the lock in a locked position, in accordance with an embodiment of the present disclosure.

DETAILED DESCRIPTION

Figure 1:
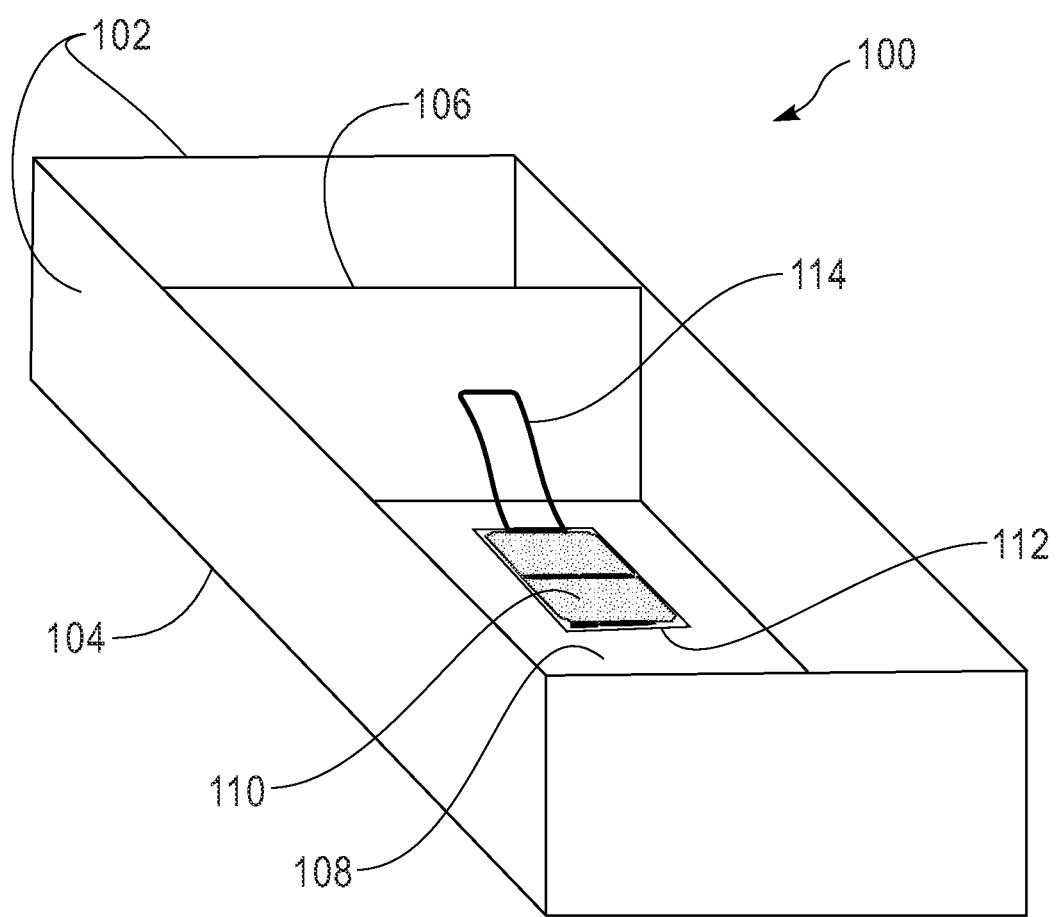
FIG. 1 is a perspective view of a server drawer, in accordance with an embodiment of the present disclosure.

Various embodiments of the present disclosure are described herein with reference to the related drawings. Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship.

The following definitions and abbreviations are to be used for the interpretation of the claims and the specification. As used herein, the terms "comprises," "comprising," "includes," "including," "has," "having," "contains," or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus. In addition, any numerical ranges included herein are inclusive of their boundaries unless explicitly stated otherwise.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on," or "positioned atop" mean that a first element, such as a first structure, is present on a second element, such as a second structure, wherein intervening elements such as an interface structure can be present between the first element and the second element.

FIG. 1 is a perspective view of server drawer 100. In the illustrated embodiment, server drawer 100 is a housing for computer components in a larger server rack (not shown). Server drawer 100 comprises four sidewalls 102, floor 104 (on the underneath side of server drawer 100), bulkhead 106, motherboard 108 (including socket 110), load frame 112, and bail 114. Sidewalls 102, floor 104, and bulkhead 106 are all rigid components (e.g., comprised of sheet metal) that stiffen and protect the electronic components of server drawer 100. In addition, bulkhead 106 can extend between two opposite sidewalls 102, for example, to further stiffen server drawer 100 and to provide mounting/guide features for the electronic components of server drawer 100.

In the illustrated embodiment, motherboard 108 is connected to floor 104, and load frame 112 is connected to both motherboard 108 and floor 104. Bail 114 is a U-shaped wire that is rotatably connected to load frame 112. Bail 114 is shown in an opened position and it is restricted from being rotated any further back by bulkhead 106.

Figure 2:
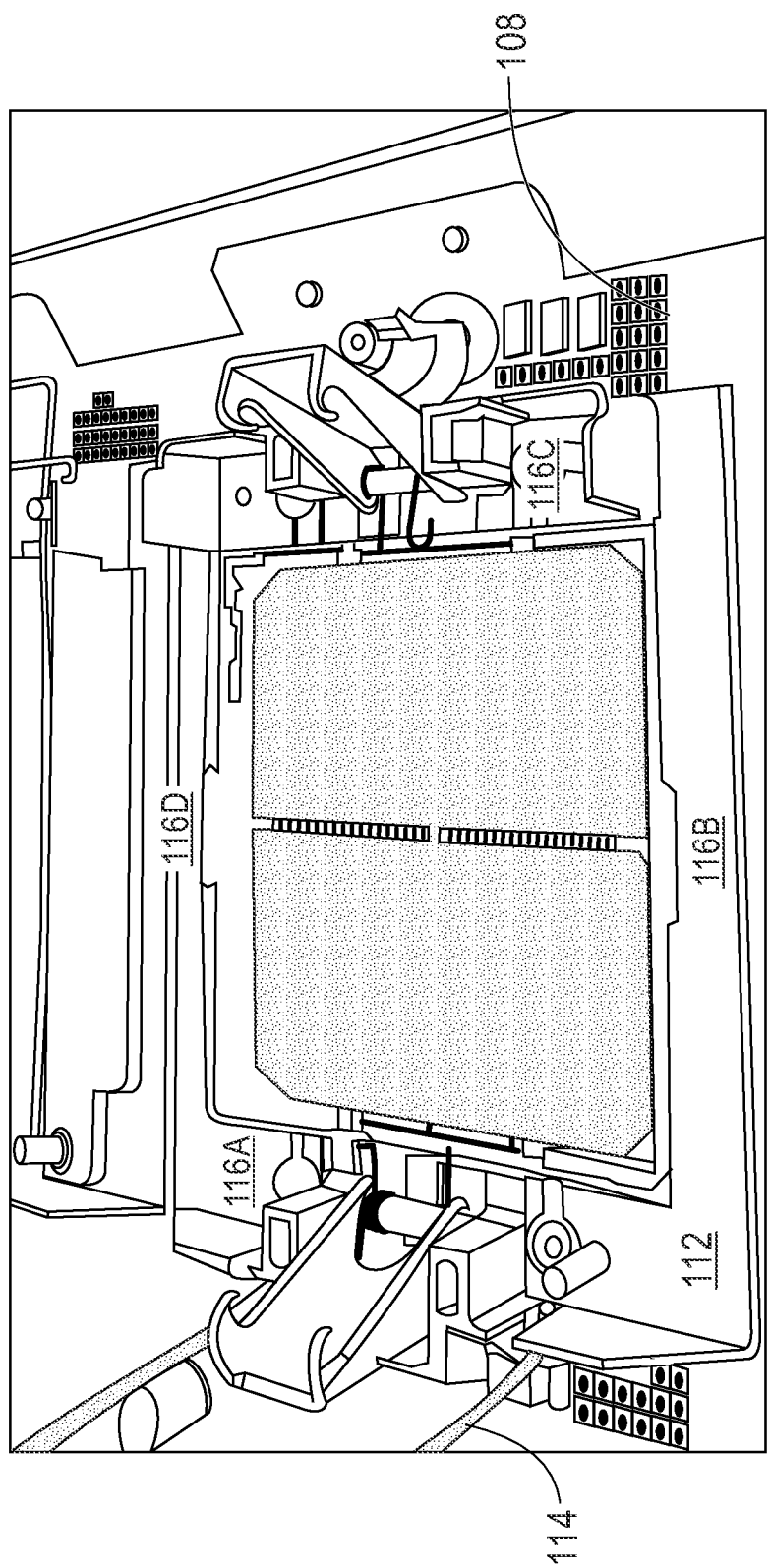
FIG. 2 is a perspective view of a processor socket and a load frame with a bail in an opened position, in accordance with an embodiment of the present disclosure.

FIG. 2 is a perspective view of socket 110 and load frame 112 with bail 114 in an opened position. In the illustrated embodiment, socket 110 is a land grid array (LGA) that is configured to connect to a computer processor. In addition, load frame 112 is a monolithic, rectangular component with sides 116A-116D (collectively, "sides 116"), wherein each side 116 of load frame 112 is adjacent to a side of socket 110. Bail 114 is rotatably connected to side 116A, and bail 114 is shown in an opened position (e.g., rotated back to at least perpendicular with respect to motherboard 108), which provides maximal access to socket 110.

Figure 3:
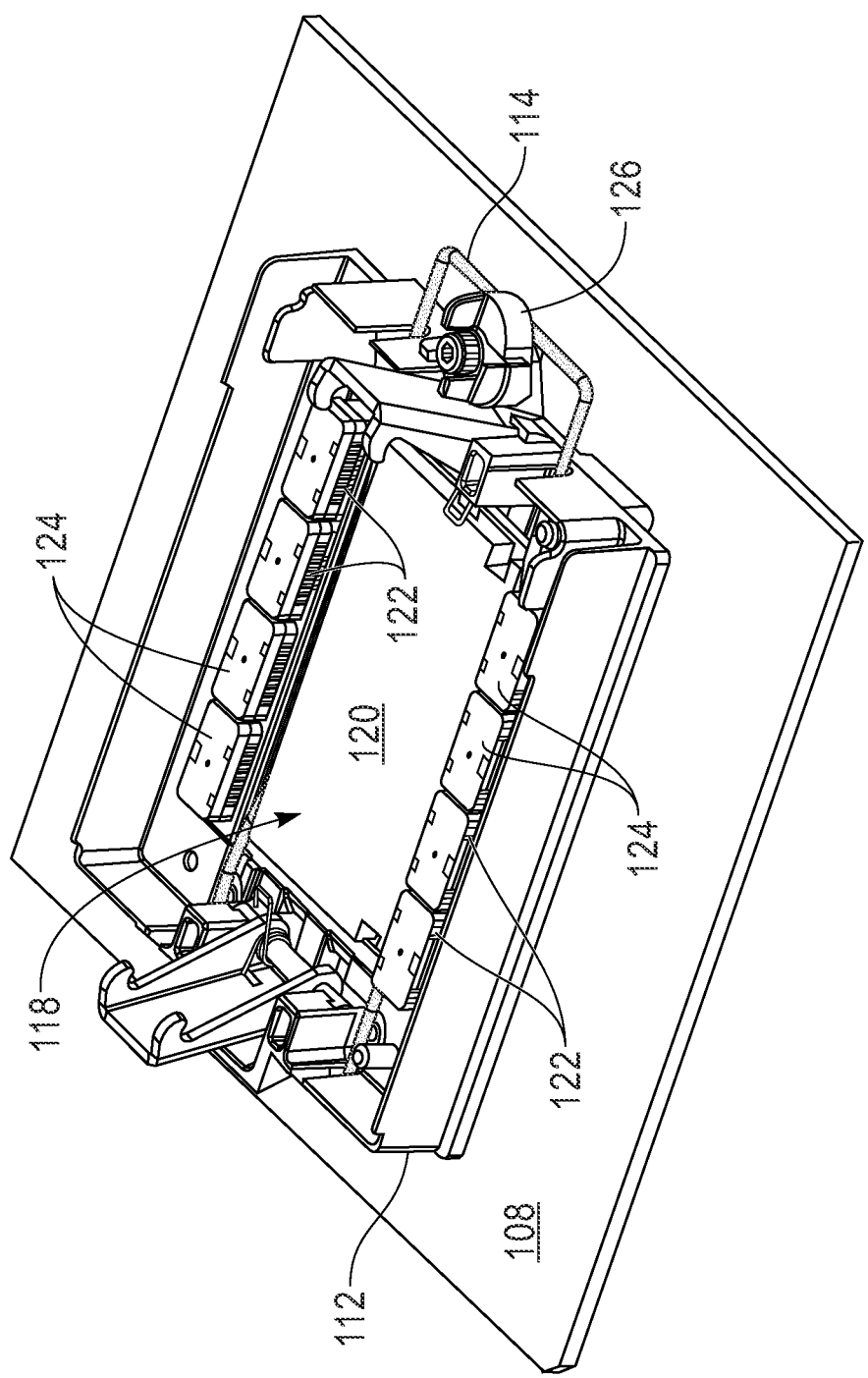
FIG. 3 is a perspective view of a processor module and the load frame with the bail in a closed position, in accordance with an embodiment of the present disclosure.

In some embodiments, load frame 112 is a two-piece component that only has two sides 116A and 116C that are opposite of socket 110 from each other. This is possible because bail 114 is only normally connected to side 116A, and, at times, bail 114 is locked to side 116C when bail 114 is in the closed position (as shown in FIG. 3). In the closed position, bail 114 extends over socket 110, although side 116C can provide a stop for bail 114 such that bail 114 cannot over rotate towards motherboard 108 and contact socket 110. This feature prevents bail 114 from damaging socket 110 when bail 114 is closed but no computer processor is present.

Figure 8:
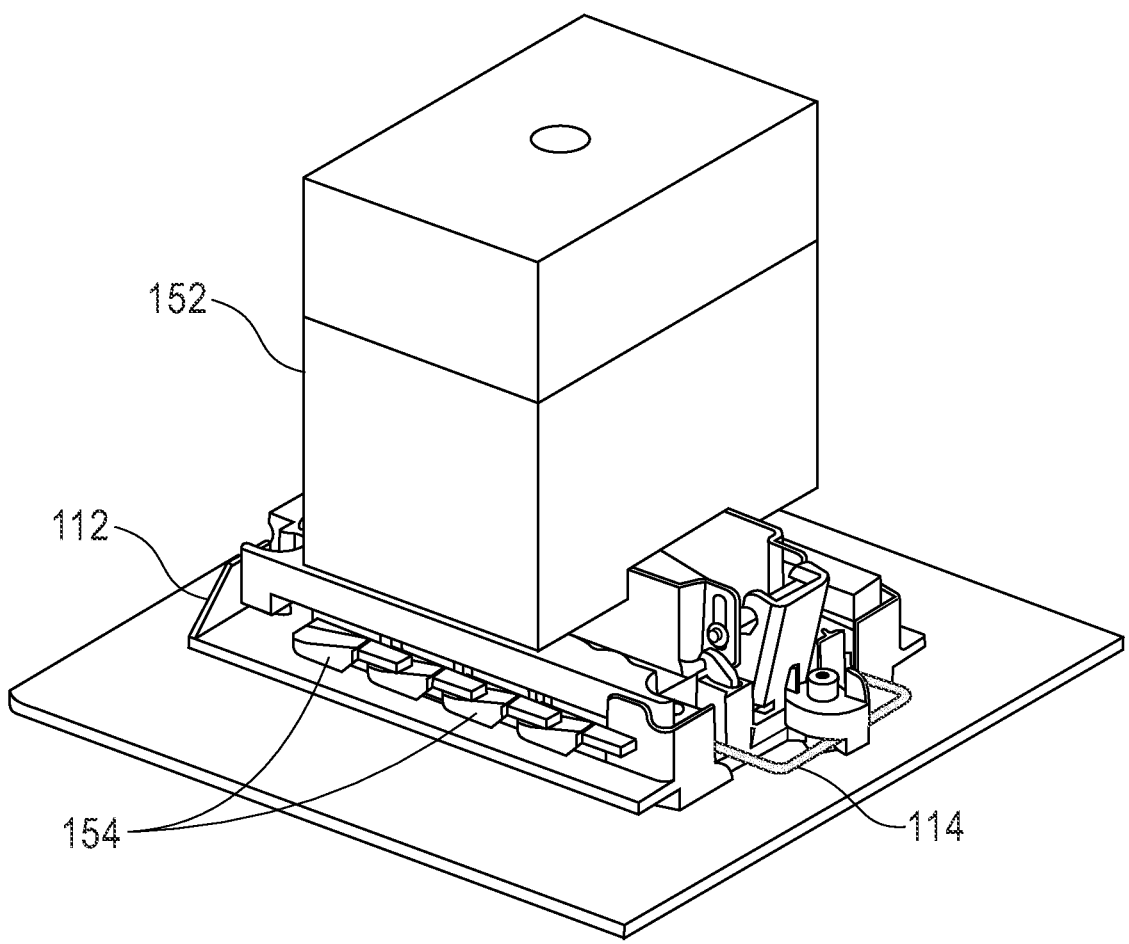
FIG. 8 is a perspective view of the load frame with a heat sink attached, in accordance with an embodiment of the present disclosure.

FIG. 3 is a perspective view of processor module (PM) 118 and load frame 112 with bail 114 in a closed position. In the illustrated embodiment, PM 118 is a computer processor that includes a central processor portion 120 and eight peripheral input/output (I/O) portions 122. Processor portion 120 includes processor hardware (not shown) with a thermal interface surface (e.g., an integrated heat spreader) at the top (for thermal connection with a heat sink, as shown in FIG. 8). Each I/O portion 122 is configured to be connected with a pluggable connector (shown in FIG. 8), although each I/O portion 122 is shown with a removable dust cover 124 to protect I/O portion 122 when a pluggable connector is not installed.

In the illustrated embodiment, PM 118 has been connected to socket 110 (shown in FIG. 2) by a technician placing PM 118 on socket 110. In addition, bail 114 has been rotated down and locked into a closed position by the technician. Bail 114 is held in the closed position by lock 126, and bail 114 is elastically deformed against PM 118 in the closed position. This results in bail 114 exerting a force against PM 118 that urges it towards motherboard 108 to retain PM 118. The magnitude of force can be, for example, between 66 Newtons (N) and 89 N (15 pounds (lbs.) to 20 lbs.). This force can be especially beneficial when upward force is exerted on PM 118, which can occur, for example, with the removal of dust covers 124 or the unplugging of pluggable connectors. This can prevent bending of PM 118, which can damage PM 118 and/or socket 110 (e.g., by bending connecting pins thereof).

Figure 4:
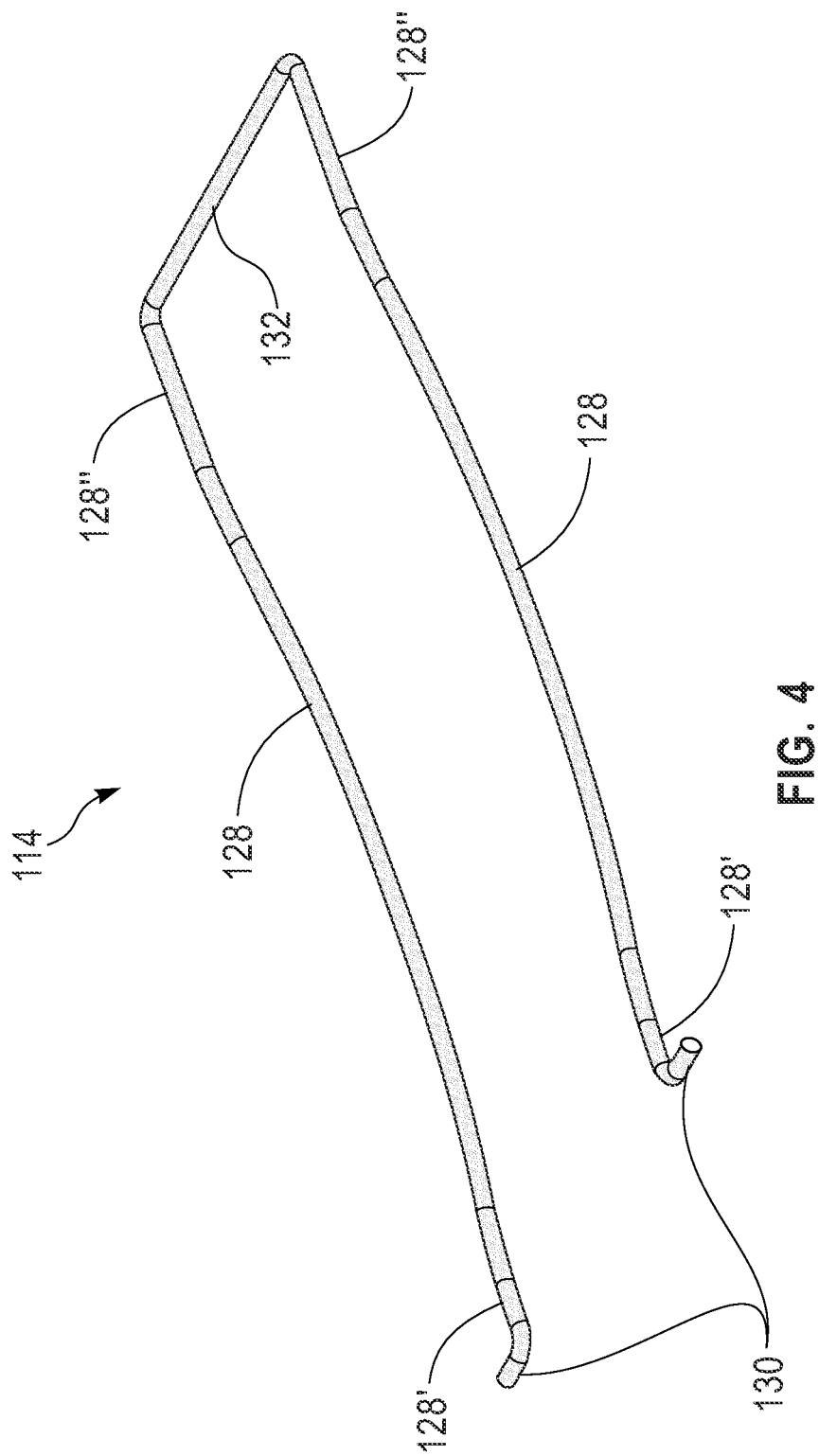
FIG. 4 is a perspective view of the bail, in accordance with an embodiment of the present disclosure.

FIG. 4 is a perspective view of bail 114. In the illustrated embodiment, bail 114 is a U-shaped wire that has a circular cross-section and two identical arms 128 that are rotatably connected to load frame 112 at pegs 130 and are joined together by bridge 132 at the other end. Bail 114 can be comprised of an elastically deformable material such as, for example, metal. This allows for bail 114 to elastically deform when it is locked in the closed position. At rest (i.e., unloaded, as shown in FIG. 4), the ends of arms 128 (denoted 128' in FIG. 4) near pegs 130 are linear, and the ends of arms 128 (denoted 128" in FIG. 4) near bridge 132 are also linear and, in some embodiments, colinear with the ends near pegs 130. In between the straight sections, arms 128 are convex towards motherboard 108 (shown in FIG. 3).

In the closed position, bail 114 is deformed and arms 128 are substantially flat. Bail 114 distributes its load across substantially the whole length of each side of PM 118 equally because of the symmetry and contour of bail 114. This inhibits PM 118 from flexing or rocking when an upward force is exerted on PM 118 (e.g., via a dust cover 124 or a pluggable connector).

Figure 5:
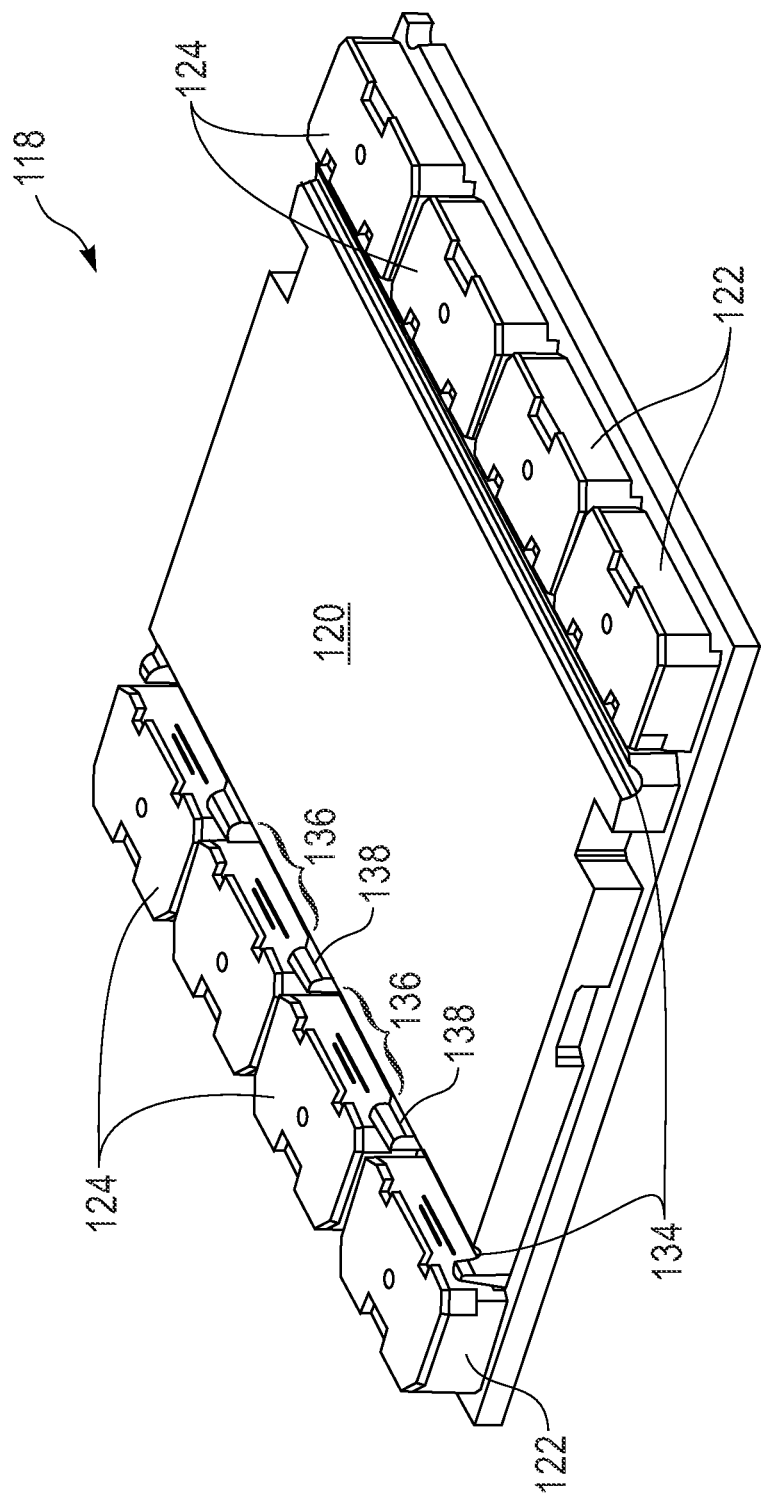
FIG. 5 is a perspective view of the processor module, in accordance with an embodiment of the present disclosure.

FIG. 5 is a perspective view of PM 118. In the illustrated embodiment, PM 118 includes grooves 134 on either side of processor portion 120, between processor portion 120 and I/O portions 122. Grooves 134 are configured to receive bail 114 (shown in FIG. 4), and in some embodiments, grooves 134 are deep enough so that bail 114 does not extend above the top surface of processor portion 120 when bail 114 is locked in the closed position. In addition, the outer sides of grooves 134 (with respect to processor portion 120) include a plurality of interruptions 136 that separate pillars 138. Thereby, the outer sides of grooves 134 can be formed by pillars 138, and interruptions 136 can provide clearance for I/O portions 122. The space allotted by interruptions 136 can be utilized, for example, by pluggable connectors and/or by a tool (not shown) configured to be used by a technician to remove the pluggable connectors and/or dust covers 124.

The components and configuration of PM 118, along with those of load frame 112 (shown in FIG. 3) and bail 114, allow for processor portion 120 to communicate via socket 110 and motherboard 108 (shown in FIG. 2) as well as directly to another computer component via I/O portions 122. In addition, grooves 134 control the positioning of bail 114 and prevent bail from interrupting the heat path from the top of processor portion 120 to a heat sink (shown in FIG. 8). While grooves 134 are shown in PM 118, a dust cover (not shown) for socket 110 can also have its own grooves. Such a dust cover could protect socket 110 when PM 118 is not present in the same way that dust covers 124 protect I/O portions 122 when pluggable sockets are not present.

FIG. 6A is a perspective view of lock 126 in an unlocked position. FIG. 6B is a perspective view of lock 126 in a locked position. FIGS. 6A and 6B will now be discussed in conjunction with one another.

In the illustrated embodiment, lock 126 is a quarter-turn mechanism that is rotatably connected to side 116C of load frame 112 by shoulder screw 140. Lock 126 has a generally cylindrical shape, although flat side 142 is present to allow for bail 114 to pass by lock 126 when lock 126 is in the unlocked position. Once bail 114 is moved down past lock 126, a technician can use tabs 144 to turn lock 126 to the locked position. Then pressure can be released from bail 114, and bridge 132 of bail 114 is engaged by yokes 146 of lock 126 to hold bail 114 in the closed position (as shown in FIG. 6B). Yokes 146 are spaced apart from one another and are symmetric with respect to bail 114 so that bail 114 is held level and twisting thereof is prevented (even when force is applied to PM 118, shown in FIG. 3).

Figure 7:
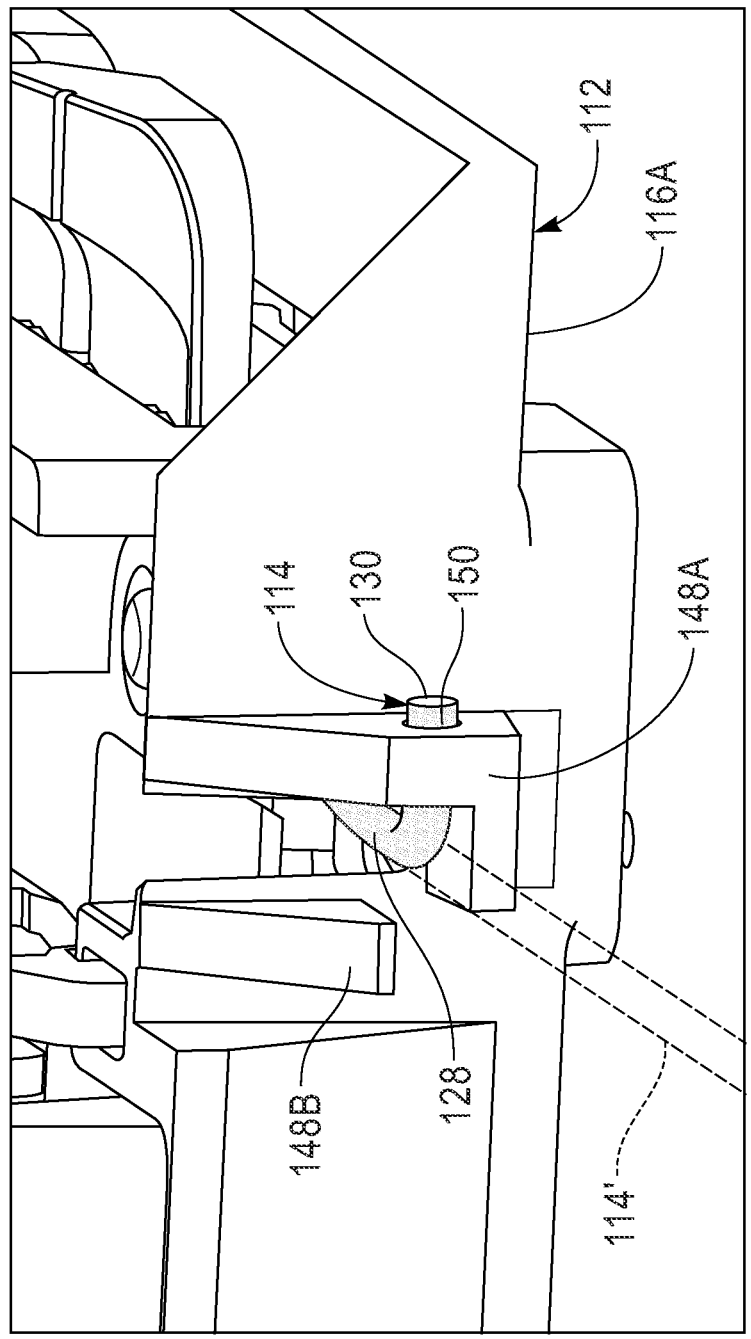
FIG. 7 is a perspective view of bail attachment lugs, in accordance with an embodiment of the present disclosure.

FIG. 7 is a perspective view of bail attachment lugs 148A and 148B (collectively, "lugs 148"). While only one pair of lugs 148 is visible in FIG. 7, there can be two pairs of lugs 148 on side 116A of load frame 112—one pair for each peg 130 of bail 114. In the illustrated embodiment, lug 148A includes aperture 150 that peg 130 passes through, which captures bail 114 but still allows bail to rotate from the closed position (as shown in FIG. 7) to the installation position 114' (shown in phantom to denote the outline of bail 114).

In the illustrated embodiment, installation position 114' is approximately one-hundred-eighty degrees from the closed position. This is because bail 114 is installed by squeezing arms 128 together, pushing pegs 130 past the end of lugs 148A, and releasing arms 128 so that pegs 130 are positioned in apertures 150. Then, to remove bail 114, arms 128 are squeezed until pegs 130 are out of apertures 150 and no longer controlled by lugs 148A. However, this operation is blocked by side 116A and/or lugs 148B when bail 114 is not in the installed position (e.g., when bail 114 is in the opened or closed positions). In some embodiments, installation and removal of bail 114 is not possible when load frame 112 is connected to motherboard 108 because bulkhead 106 (shown in FIG. 1) prevents bail 114 from rotating beyond lugs 148B into installation position 114'.

FIG. 8 is a perspective view of load frame 112 with heat sink 152 attached. In the illustrated embodiment, heat sink 152 is thermally connected to PM 118 (specifically to processor portion 120 thereof, shown in FIG. 3). In addition, pluggable connectors 154 are attached to I/O portions 122 (shown in FIG. 3) of PM 118.

As stated above, in some embodiments, bail 114 sits below the top of PM 118, although in other embodiments, the bottom surface of heat sink 152 includes grooves (similar to grooves 134, shown in FIG. 5) to ensure that bail 114 (shown in FIG. 3) does not inhibit heat transfer between PM 118 and heat sink 152. In each of these embodiments, heat sink 152 and pluggable connectors 154 can be attached while bail 114 is in the closed position. This capability means that bail 114 does not need to be removed during the assembly process of server drawer 100 (shown in FIG. 1), while still providing a secured place for bail 114 to be. In addition, during the disassembly process of server drawer 100, bail 114 will be in place to retain PM 118 in case some or all of heat sink 152 and pluggable connectors 154 need to be removed.

Figure 9:
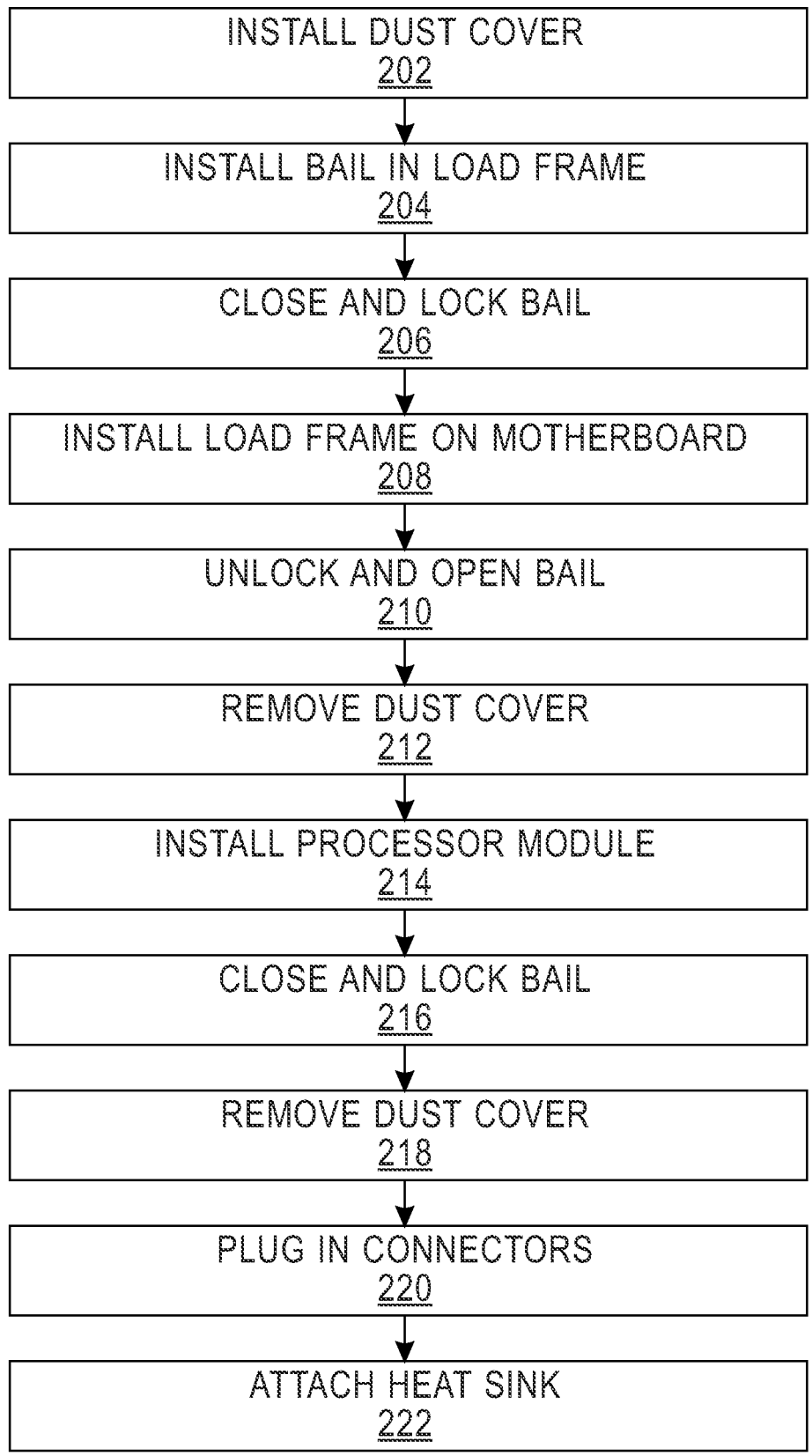
FIG. 9 is a flowchart of a method of assembling the server drawer, in accordance with an embodiment of the present disclosure.

FIG. 9 is a flowchart of method 200 of assembling server drawer 100. In the description of method 200, references may be made to the features from FIGS. 1-8.

In the illustrated embodiment, at operation 202, a dust cover is installed on load frame 112. At operation 204, bail 114 is installed in load frame 112. At operation 206, bail 114 is moved into the closed position and locked by lock 126. At operation 208, load frame 112 is installed on motherboard 108. At operation 210, bail 114 is unlocked and moved into the opened position. At operation 212, the dust cover on socket 110 is removed. At operation 214, PM 118 is installed on socket 110.

In the illustrated embodiment, at operation 216, bail 114 is rotated to the closed position, which includes positioning arms 128 in grooves 134, respectively. Also, at operation 216, lock 126 is rotated one-quarter turn from the unlocked position to the locked position. At operation 218, dust covers 124 are removed from some or all of I/O sockets 122. At operation 220, pluggable connectors 154 are connected to I/O sockets 122, as appropriate. At operation 222, heat sink 152 is connected to load frame 112 and is thermally connected to processor portion 120 of PM 118. If desired, server drawer 100 can be disassembled in reverse order.

In addition, certain operations can occur simultaneously and/or in different order than is shown in FIG. 9. For example, operation 202 can occur after operation 204 or 208.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An apparatus comprising:
   a motherboard with a processor socket;
   a load frame connected to the motherboard adjacent to at least two sides of the processor socket;
   a processor retainer rotatably connected to the load frame, the processor retainer being positionable in a closed position, an opened position, and an installation position; and
   a processor module connected to the processor socket;
   wherein the processor retainer contacts the processor module when the processor retainer is in the closed position; and
   wherein the processor retainer extends over the processor socket when the processor retainer is in the closed position.

2. The apparatus of claim 1, wherein the processor retainer urges the processor module towards the processor socket when the processor retainer is in the closed position.

3. The apparatus of claim 2, wherein:
   the processor module comprises a processor portion and an input/output portion; and
   the processor retainer contacts the processor module between the processor portion and the input/output portion.

4. The apparatus of claim 2, wherein:
   the processor module comprises a groove; and
   the processor retainer contacts the processor module in the groove.

5. The apparatus of claim 4, wherein the groove is interrupted in multiple positions.

6. The apparatus of claim 1, wherein the processor retainer is a U-shaped wire.

7. The apparatus of claim 1, further comprising a lock that is configured to engage the processor retainer when the processor retainer is in the closed position.

8. The apparatus of claim 7, wherein the lock comprises two spaced apart yokes that contact the processor retainer when the lock engages the processor retainer.

9. The apparatus of claim 1, wherein the load frame blocks the processor retainer from contacting the processor socket.

10. A method of assembling a computer assembly, the method comprising:
   installing a load frame on a motherboard with a processor socket such that the load frame is adjacent to at least two sides of the processor socket;
   opening a processor retainer that is rotatably connected to the load frame, wherein the processor retainer is positionable in a closed position, an opened position, and an installation position;
   installing a processor module on the motherboard by connecting the processor module to the processor socket;

closing the processor retainer over the processor module such that the processor retainer extends over the processor socket when the processor retainer is in the closed position; and locking the processor retainer such that the processor retainer contacts the processor module and urges the processor module towards the motherboard.

11. The method of claim 10, further comprising installing a heat sink on the processor module with the processor retainer locked over the processor module.

12. The method of claim 11, further comprising connecting an input/output connector to the processor module before installing the heat sink.

13. The method of claim 10, further comprising rotatably connecting the processor retainer to the load frame prior to installing the load frame on the motherboard.

14. The method of claim 10, wherein locking the processor retainer comprises turning a lock less than a full turn.

15. The method of claim 10, wherein closing the processor retainer comprises positioning the processor retainer in a groove in the processor module between a processor and an input/output connector.

16. A system comprising:
a housing comprising four walls and a bulkhead extending between two opposite walls;
a motherboard connected to the housing and including a processor socket;
a load frame connected to the motherboard and surrounding the processor socket; and
a processor retainer connected to the load frame, the processor retainer being positionable in a closed position, an opened position, and an installation position;
wherein the processor retainer is removable from the load frame in the installation position but not removable in the closed position and in the opened position; and
wherein the housing blocks the processor retainer from being positioned in the installation position when the load frame is connected to the motherboard; and
wherein the bulkhead blocks the processor retainer from being positioned in the installation position when the load frame is connected to the motherboard.

17. The system of claim 16, wherein the processor retainer is a U-shaped wire.

18. The system of claim 16, further comprising a heat sink connected to the load frame.

19. The system of claim 16, further comprising a lock connected to the load frame and configured to engage the processor retainer when the processor retainer is in the closed position.

* * * * *